(12) United States Patent  
Schliwa et al.

(10) Patent No.: US 8,149,888 B1  
(45) Date of Patent: Apr. 3, 2012

(54) SINGLE PHOTON SOURCE

(75) Inventors: Andrei Schliwa, Storkow (DE); Erik Stock, Berlin (DE); Dieter Bimberg, Berlin (DE)

(73) Assignee: Technische Universitat Berlin, Berlin (DE)

( * ) Notice: Subject to any disclaimer, the term of this patent is extended or adjusted under 35 U.S.C. 154(b) by 43 days.

(21) Appl. No.: 12/891,437

(22) Filed: Sep. 27, 2010

(51) Int. Cl.  
*H01S 5/00* (2006.01)

(52) U.S. Cl. .................................. 372/45.011

(58) Field of Classification Search ............ 372/45.011, 372/45.012; 359/326  
See application file for complete search history.

(56) References Cited

U.S. PATENT DOCUMENTS

| | | |
|---|---|---|
| 6,717,964 B2 | 4/2004 | Jiang et al. |
| 2008/0112308 A1 | 5/2008 | Cleveland |
| 2010/0074293 A1* | 3/2010 | Lochmann et al. ...... 372/45.012 |

FOREIGN PATENT DOCUMENTS

| | | |
|---|---|---|
| DE | 10 2005 057 800 A1 | 6/2007 |
| DE | 10 2008 036 400 B3 | 1/2010 |
| WO | WO-2010/012268 A2 | 2/2010 |

OTHER PUBLICATIONS

Gisin, et al. "Quantum cryptography" Reviews of Modern Physics, Jan. 2002, vol. 74, No. 1, pp. 145-195.

Gobby, et al. "Unconditionally secure quantum key distribution over 50 km of standard telecom fibre", Electronics Letters, Dec. 9, 2004, vol. 40, No. 25, pp. 1603 & 1604.

Knill, et al. "A scheme for efficient quantum computation with linear optics" Nature, Jan. 4, 2001, vol. 409, pp. 46-52.

Seguin, et al. "Size-Dependent Fine-Structure Splitting in Self-Organized InAs/GaAs Quantum Dots", The American Physical Society, week ending Dec. 16, 2005, vol. 95, pp. 257402-1 to 257402-4.

Shields, Andrew "Quantum Logic with Light, Glass, and Mirrors" Science, Sep. 13, 2002, vol. 297, pp. 1821-1822.

Tittel, et al. "Violation of Bell Inequalities by Photons More Than 10 km Apart", The American Physical Society, Oct. 26, 1998, vol. 81, No. 17, pp. 3563-3566.

Zander, et al. "Epitaxial quantum dots in stretchable optical microcavities" Optics Express, Dec. 7, 2009, vol. 17, No. 25, pp. 22452-22461.

* cited by examiner

*Primary Examiner* — Jessica Stultz  
*Assistant Examiner* — Tuan Nguyen  
(74) *Attorney, Agent, or Firm* — Foley & Lardner LLP

(57) ABSTRACT

An embodiment of the invention relates to a single-photon source for emitting single photons, comprising a cavity having a first mirror and a second mirror and exhibiting a longitudinal resonance frequency between the first and second mirror; at least one quantum dot arranged inside said cavity, said quantum dot being strain-dependent and configured to generate radiation at a strain-dependent radiation frequency; a device capable of exciting the quantum dot to generate radiation; a piezoelectric crystal being arranged outside the cavity and mechanically coupled to the second mirror's outer surface, said piezoelectric crystal configured to receive a control voltage and capable of applying either a laterally tensile and vertically compressive strain to both the cavity and the quantum dot, or a laterally compressive and vertically tensile strain to both the cavity and the quantum dot, depending on the control voltage's polarity; wherein, in response to said strain, the resonance frequency and the radiation frequency shift in opposite directions.

19 Claims, 4 Drawing Sheets

SINGLE PHOTON SOURCE

The invention relates to single-photon sources. Single-photon sources are photon sources which can emit single photons, particularly with a defined or predetermined polarization, transposed photons and cascades of correlated photons.

BACKGROUND OF THE INVENTION

Single-photon sources are the core element of quantum cryptography. In the exchange of sensitive data such as e.g. online business transactions, they offer absolute interception protection based on the laws of quantum mechanics.

An ideal single-photon source (photon gun) is a component which emits a single photon after a trigger signal, and only then (on demand). The central element of a single-photon source is optimally a quantized system with discrete energy levels.

German Patent Application DE 10 2008 036 400 describes a single-photon source having a cylindrical cavity. The cavity comprises a first mirror and a second mirror and exhibits a longitudinal resonance frequency between the first and second mirrors. The single-photon source emits photons efficiently only if the quantum dot's radiation frequency corresponds to the cavity's longitudinal resonance frequency. As such, the quality factor of the cavity needs to be limited since a large quality factor would reduce the chance that the radiation frequency matches the cavity's longitudinal resonance frequency. In summary, the tolerance range of this type of single-photon source is small, and the fabrication yield is poor.

OBJECTIVE OF THE PRESENT INVENTION

An objective of the present invention is to provide a single-photon source which has a larger tolerance range for fabrication than prior art single photon sources.

A further objective of the present invention is to provide a single-photon source that allows including cavities having a higher Q-factor than prior art single photon sources.

Furthermore, it is an objective of the present invention to provide a single-photon source that allows efficiently compensating temperature drifts.

BRIEF SUMMARY OF THE INVENTION

An embodiment of the present invention relates to a single-photon source for emitting single photons, comprising a cavity having a first mirror and a second mirror and exhibiting a longitudinal resonance frequency between the first and second mirror; at least one quantum dot arranged inside said cavity, said quantum dot being strain-dependent and configured to generate radiation at a strain-dependent radiation frequency; a device capable of exciting the quantum dot to generate radiation; a piezoelectric crystal being arranged outside the cavity and mechanically coupled to the second mirror's outer surface, said piezoelectric crystal configured to receive a control voltage and capable of applying either a laterally tensile and vertically compressive strain to both the cavity and the quantum dot, or a laterally compressive and vertically tensile strain to both the cavity and the quantum dot, depending on the control voltage's polarity; wherein, in response to said strain, the resonance frequency and the radiation frequency shift in opposite directions.

The cavity is oriented along and photon emission occurs in the vertical direction. A lateral direction is any direction that is perpendicular to the vertical direction along which the cavity is oriented and photons are emitted. A lateral direction is a direction in 3-dimensional space that is perpendicular to the vertical direction.

According to this embodiment of the invention, the resonance frequency and the radiation frequency are shifted in opposite directions in response to strain. This is achieved by applying the same kind of strain (laterally tensile and vertically compressive or laterally compressive and vertically tensile) to both the cavity and the quantum dot. As such, by applying a voltage of the appropriate polarity, the resonance frequency and the radiation frequency may always be brought to a match. Thus, it is not mandatory that the resonance frequency and the radiation frequency match exactly after fabrication of the single-photon source since a mismatch may later be corrected by simply applying a voltage to the piezoelectric crystal. Further, in case the temperature changes, any drift of the resonance frequency relative to the radiation frequency may be easily compensated.

The device capable of exciting the quantum dot to generate radiation may be a charge carrier injection device which is capable of injecting charge carriers into the cavity in order to excite the quantum dot to generate radiation. Alternatively the device may be an optical pump source which excites the quantum dot optically.

According to a preferred embodiment, the quantum dot is configured to increase its radiation frequency in case of laterally compressive and vertically tensile strain, and to decrease its radiation frequency in case of laterally tensile and vertically compressive strain.

The laterally tensile and vertically compressive strain preferably reduces the distance between the first and second mirror and increases the cavity's resonance frequency. The laterally compressive and vertically tensile strain preferably increases the distance between the first and second mirror and decreases the cavity's resonance frequency.

The photons are preferably coupled out of the cavity through the first mirror if the emission frequency corresponds to the longitudinal resonance frequency of the cavity.

The strain induced by the piezoelectric crystal inside the cavity and inside the quantum dot, is preferably biaxial.

The first and second mirror may each comprise distributed Bragg reflectors.

The piezoelectric crystal may have a surface section that is mechanically coupled to the second mirror's outer surface, and a given thickness. The size of the surface section preferably increases and the thickness preferably decreases if the control voltage has a first polarity, and the surface size of the surface section preferably decreases and the thickness preferably increases if the control voltage has an opposite second polarity.

The surface section of the piezoelectric crystal is preferably as large as the second mirror's outer surface or larger than the second mirror's outer surface.

Preferably, the surface section of the piezoelectric crystal completely covers the second mirror's outer surface—seen along the beam path of the photons leaving the cavity through the first mirror.

The piezoelectric crystal may be a piezoelectric crystal layer having a surface section that is mechanically coupled to the second mirror's outer surface, and a given layer thickness. The size of the surface section preferably increases and the layer thickness preferably decreases if the control voltage has a first polarity, and the size of the surface section preferably decreases and the thickness preferably increases if the control voltage has an opposite second polarity.

Preferably, an insulator is arranged between the piezoelectric crystal and the second mirror's outer surface, the insulator being configured to electrically insulate the piezoelectric crystal from the second mirror's outer surface and to forward the mechanical strain of the piezoelectric crystal to the cavity.

The cavity is preferably arranged on a front surface of a substrate and the piezoelectric crystal is preferably arranged on a back surface of the substrate. The substrate may be formed by an etch stop layer. Such an etch stop layer may have been placed on a preliminary substrate that is removed during the processing of the device.

An insulator may be arranged between the piezoelectric crystal and the back surface of the substrate, the insulator being configured to electrically insulate the piezoelectric crystal from the substrate and to forward the mechanical strain of the piezoelectric crystal though the substrate to the cavity.

The single-photon source may have a controller and a voltage source, which is connected to the piezoelectric crystal and controlled by the controller. The controller is preferably adapted to control the voltage of the voltage source such that the quantum dot's emission frequency corresponds to the longitudinal resonance frequency of the cavity.

The cavity preferably forms a cylinder, and the quantum dot is preferably arranged inside the cylindrical cavity. The base contour of the cylindrical cavity may be of any form. For instance, the base contour may be a circle, a square, a rectangle, an ellipse, etc. The first and second mirrors are preferably arranged at the upper and lower cylinder end faces of the cylindrical cavity.

The quantum dot is preferably arranged in or adjacent (below or above) a current aperture that focuses charge carriers onto the quantum dot. The current aperture may be formed by an insulating layer having an opening. The quantum dot is preferably arranged in or adjacent (below or above) this opening. The insulating layer is preferably arranged parallel to the first and second mirror.

The quantum dot is preferably comprised by an active layer which is parallel to the first and second mirror. In this way, the same kind of strain (laterally tensile and vertically compressive or laterally compressive and vertically tensile) may be easily induced to both the cavity and the quantum dot by applying strain to the second mirror's surface. The active layer is preferably also parallel to the insulating layer of the current aperture.

According to a further preferred embodiment, the cavity is cylindrical and forms a cylinder; the first and second mirrors are arranged at opposite cylinder end faces of the cylinder; the piezoelectric crystal is a piezoelectric crystal layer; and the quantum dot is comprised by an active layer which is parallel to the first and second mirror and the piezoelectric crystal layer. The quantum dot may be arranged in or adjacent to a current aperture that focuses charge carriers onto the quantum dot, the current aperture being formed by an insulating layer having an opening, and the quantum dot being arranged in or adjacent to the opening. The insulating layer may be arranged parallel to the first and second mirror, the active layer, and the piezoelectric crystal layer.

The invention also relates to a method of emitting single photons, particularly for use in quantum cryptography, using a single-photon source having a cavity and at least one quantum dot arranged therein, the method comprising the step of:
applying a voltage to a piezoelectric crystal being arranged outside the cavity and mechanically coupled to the cavity,
wherein in response to said voltage the piezoelectric crystal applies either a laterally tensile and vertically compressive strain to the cavity and the quantum dot, or a laterally compressive and vertically tensile strain, depending on the control voltage's polarity, and thereby shifts the resonance frequency and the radiation frequency in opposite directions.

The laterally tensile and vertically compressive strain may reduce the distance between the first and second mirror, increase the cavity's resonance frequency, and decrease the strain-dependent radiation frequency. The laterally compressive and vertically tensile strain may increase the distance between the first and second mirror, decrease the cavity's resonance frequency, and increase the strain-dependent radiation frequency. The voltage applied to the piezoelectric crystal may be varied until the emission frequency corresponds to the longitudinal resonance frequency of the cavity.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof which are illustrated in the appended figures. Understanding that these figures depict only typical embodiments of the invention and are therefore not to be considered to be limiting of its scope, the invention will be described and explained with additional specificity and detail by the use of the accompanying drawings in which.

DETAILED DESCRIPTION OF THE PREFERRED EMBODIMENTS

The preferred embodiments of the present invention will be best understood by reference to the drawings, wherein identical or comparable parts are designated by the same reference signs throughout.

It will be readily understood that the present invention, as generally described herein, could vary in a wide range. Thus, the following more detailed description of the exemplary embodiments of the present invention, is not intended to limit the scope of the invention, as claimed, but is merely representative of presently preferred embodiments of the invention.

Figure 1:
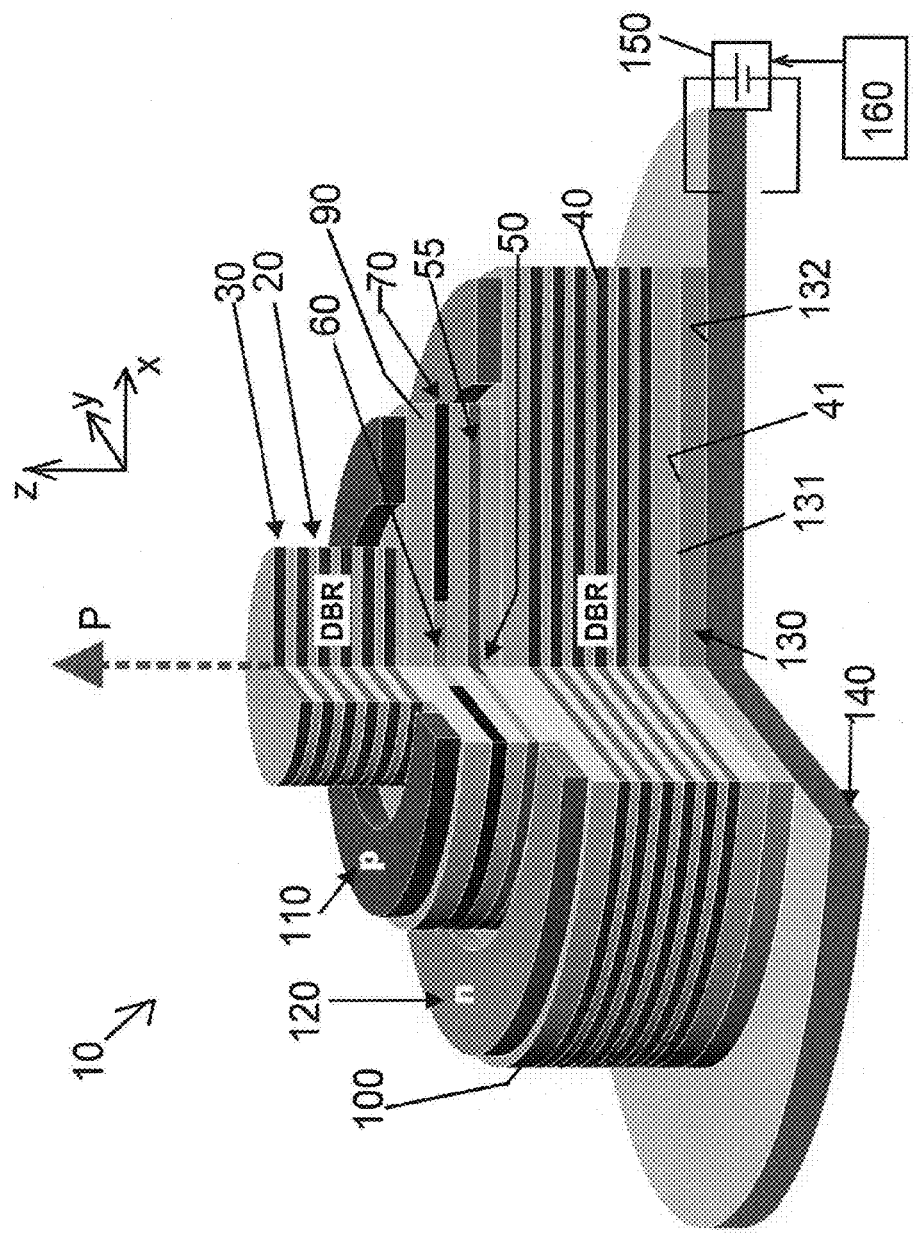
FIG. 1 shows a first exemplary embodiment of a single photon emitter according to the present invention.

FIG. 1 shows a first exemplary embodiment of a single-photon source 10 according to the present invention. The single-photon source 10 comprises a cylindrical cavity 20 having a first mirror 30 and a second mirror 40. The first mirror 30 and the second mirror 40 may be distributed Bragg reflectors DBR as indicted in an exemplary fashion in FIG. 1. The distributed Bragg reflectors DBR may consist of Al(Ga)$O_x$-material.

The cavity 20 exhibits a plurality of longitudinal resonance frequencies between the first and second mirror 30 and 40. The longitudinal resonance frequencies depend on the distance between both mirrors 30 and 40.

At least one quantum dot 50 is formed in an active layer 55 and arranged inside the cavity 20. The quantum dot 50 is positioned inside or adjacent (above or below) an opening 60 of a non-conductive layer 70. The opening 60 is filled with conductive semiconductor material such as AlGaAs. The non-conductive layer 70 forms a current aperture through which electrical current may flow in vertical direction. The current aperture focuses the electrical current towards the single quantum dot 50 in order to increase the current efficiency and to avoid pumping of other (unused) quantum dots, which might be positioned in the active layer 55.

The quantum dot 50 generates radiation at a specific radiation frequency when charge carriers (e.g. electrons and holes) are injected therein. The quantum dot 50 preferably consists of semiconductor material such as InGaAs material, and is thus very strain-dependent. As such, the radiation frequency of the emitted radiation is also very strain-dependent.

A charge carrier injection device is formed by a p-doped contact layer 90 and an n-doped contact layer 100. If a positive voltage is applied to the contacts 110 and 120, which are connected with both contact layers 90 and 100, charge carriers are generated and injected into the cavity 20. These charge carriers excite the quantum dot 50 to generate radiation in form of single photons P. The photons P are coupled out of the cavity 20 through the first mirror 30 if the emission frequency corresponds to the longitudinal resonance frequency of the cavity 20.

The contacts 110 and 120 may be within the cavity or outside the mirrors. In FIG. 1, the contacts 110 and 120 are additionally marked as "p" and "n" since they contact the p-doped layer 90 and the n-doped layer 100, respectively.

As can be seen in FIG. 1, the second mirror's outer surface 41 is arranged on the front surface 131 of a substrate 130. A piezoelectric crystal 140 is arranged on the back surface 132 of the substrate 130. The substrate 130 may consist of GaAs semiconductor material.

The piezoelectric crystal 140, which may consist of PMN-PT (lead magnesium niobate-lead titanate $Pb(Mg_{1/3}Nb_{2/3})O_3$—$PbTiO_3$) material, is electrically connected to a controllable voltage source 150 which is controlled by a controller 160.

The piezoelectric crystal 140 is mechanically coupled to the second mirror's outer surface 41 through the substrate 130. As such, the piezoelectric crystal 140 may apply either a laterally tensile and vertically compressive strain to the cavity 20 and the quantum dot 50 inside the cavity 20, or a laterally compressive and vertically tensile strain. The kind of strain depends on the control voltage's polarity. Therefore, the controller 160 may influence and control the emission behavior of the quantum dot 50 and the resonance frequency of the cavity 20 by applying an appropriate control voltage.

In order to efficiently transfer the mechanical stress induced by the piezoelectric crystal 140 into the cavity 20, the upper surface of the piezoelectric crystal 140 is preferably larger than the second mirror's outer surface 41 and preferably interacts with the entire second mirror's outer surface 41.

The active layer 55 is preferably arranged parallel to the first and second mirror 30 and 40. As such, the same kind of strain (laterally tensile and vertically compressive or laterally compressive and vertically tensile) is induced to both the cavity and the quantum dot when strain is induced to the second mirror's surface 41.

As discussed above, the embodiment shown in FIG. 1 comprises a substrate 130 which separates the piezoelectric crystal 140 from the second mirror's outer surface. In order to provide efficient transfer of mechanical strain from the piezoelectric crystal 140 to the second mirror 40, the quantum dot 50 and the first mirror 30, the thickness of substrate 130 should be as small as possible, or the substrate 130 should be omitted, if possible.

For instance, the substrate 130 as shown in FIG. 1, may be formed by an etch stop layer which was formerly placed on top of a preliminary substrate (not shown in FIG. 1) during the fabrication of the second mirror 40, the quantum dot 50 and the first mirror 30. During said fabrication, the second mirror 40, the quantum dot 50 and the first mirror 30 may be deposited on the etch stop layer which is placed on top of the preliminary substrate. Afterwards, the preliminary substrate is removed, for instance by etching. The remaining structure composed of the second mirror 40, the quantum dot 50, the first mirror 30, and the etch stop layer may then be equipped with the piezoelectric crystal 140.

In the embodiment shown in FIG. 1, the cavity is oriented along and photon emission occurs in the vertical direction "z". A lateral direction is any direction (e.g. "x" and "y") that is perpendicular to the vertical direction "z" along which the cavity is oriented and photons are emitted. A lateral direction is a direction in 3-dimensional space that is perpendicular to the vertical direction "z".

Figure 2:
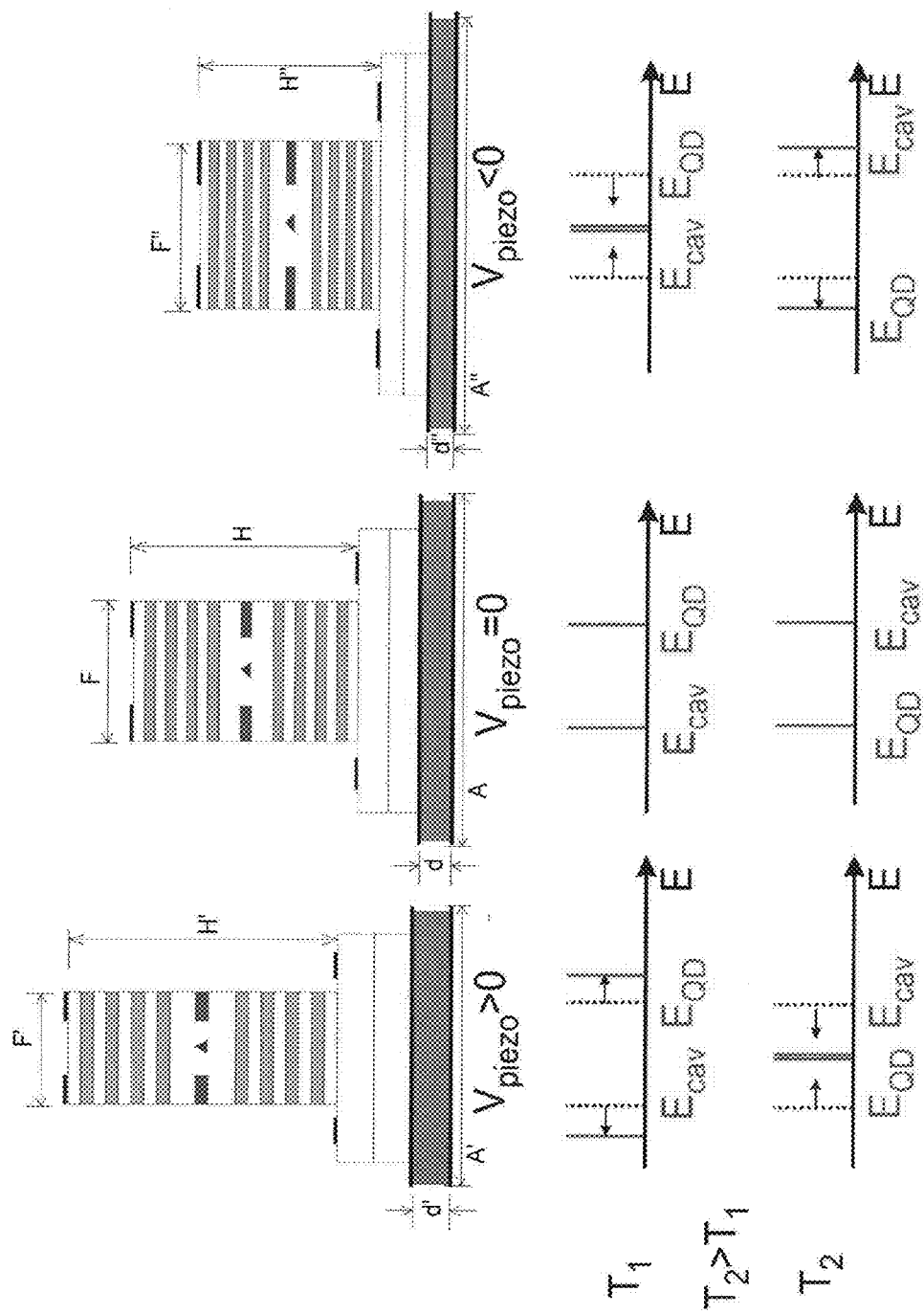
FIG. 2 shows the single photon emitter according to FIG. 1 if an electric voltage is applied to the piezoelectric crystal.

FIG. 2 shows the embodiment of FIG. 1 during operation. In the middle section of FIG. 2, the voltage $V_{piezo}$ is zero and no strain is applied to the cavity 20 or the quantum dot 50. In the following, it is assumed that the radiation frequency $f_{QD}$ of the photons generated by the quantum dot 50 does not match with the resonance frequency $f_{cav}$ of the cavity 20 at a given temperature T1. As such the photon energy $E_{QD}=h*f_{QD}$ does not equal the resonance energy $E_{cav}=h*f_{cav}$ either.

Figure 3:
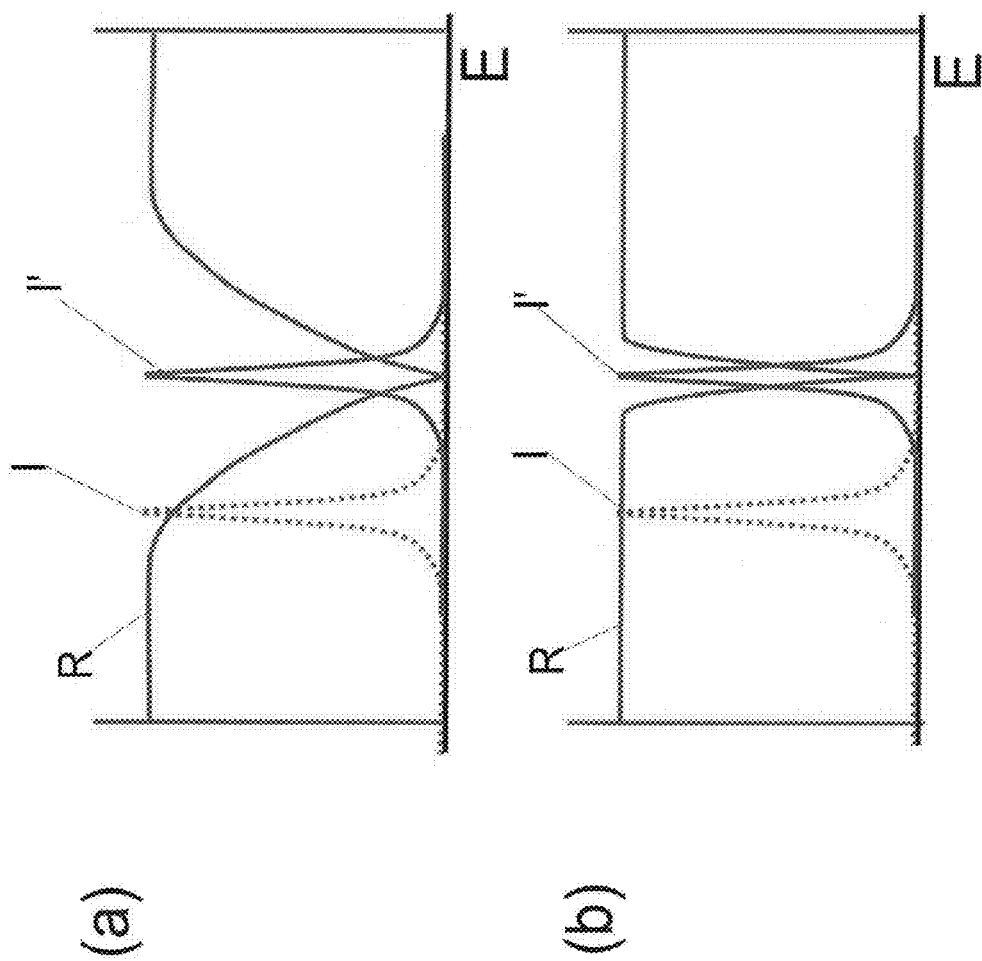
FIG. 3 shows in an exemplary fashion the frequency characteristic of two cavities having different Q-factors.

Depending on the cavity's quality factor, there is no efficient emission of photons P when the emission frequency of the radiation does not lie in the spectral transmission window of the cavity 20. This is shown in FIGS. 3a and 3b by two examples. The cavity's quality factor is indicated by the reflection characteristics R of the cavity 20.

In FIG. 3a, the cavity's quality factor is small and the radiation I is emitted even though the radiation frequency $f_{QD}$ does not perfectly match the cavity dip, i.e. the resonance frequency $f_{cav}$ of the cavity 20. In FIG. 3b, the cavity's quality factor is better and the radiation I is not emitted since the radiation frequency $f_{QD}$ does not match the resonance frequency $f_{cav}$ of the cavity 20. In order to increase (FIG. 3a) or enable (FIG. 3b) an efficient emission of radiation the radiation frequency $f_{QD}$ and the resonance frequency $f_{cav}$ need to be shifted relative to each other as indicated by reference numeral I' in FIGS. 3a and 3b.

Referring again to FIG. 2, one can see that by applying a positive voltage $V_{piezo}$ to the piezoelectric crystal 140 at the temperature T1, a laterally compressive and vertically tensile strain is induced in the piezoelectric crystal 140, the cavity 20, and the quantum dot 50. The thickness of the piezoelectric crystal 140 increases from a thickness d ($V_{piezo}=0$) to a larger thickness d' ($V_{piezo}>0$), and the surface A of the piezoelectric crystal 140 decreases from a value A ($V_{piezo}=0$) to a reduced value A' ($V_{piezo}>0$). This mechanical deformation has an impact on the cavity 20 and the quantum dot 50. The distance H between both mirrors 30 and 40 increases, and the resonance frequency $f_{cav}$ and the resonance energy $E_{cav}$ decrease. Due to the deformation of the quantum dot 50, the photon energy $E_{QD}$ of the quantum dot 50 increases. As such, applying a positive voltage $V_{piezo}$ does not increase the radiation efficiency since $E_{cav}$ and $E_{QD}$ further separate from each other.

However, by applying a negative voltage $V_{piezo}$ to the piezoelectric crystal 140 at the temperature T1, the radiation efficiency will be increased. A negative voltage $V_{piezo}$ induces a laterally tensile and vertically compressive strain in the piezoelectric crystal 140, the cavity 20, and the quantum dot 50. It can be seen in FIG. 2 that the thickness of the piezoelectric crystal 140 decreases from a thickness d ($V_{piezo}$=0) to a smaller thickness d" ($V_{piezo}$<0), and the surface A of the piezoelectric crystal 140 increases from a value A ($V_{piezo}$=0) to a larger value A" ($V_{piezo}$<0). Again, this mechanical deformation has an impact on the cavity 20 and the quantum dot 50. The distance H between both mirrors 30 and 40 decreases, and the resonance frequency $f_{cav}$ and the resonance energy $E_{cav}$ increase. Due to the deformation of the quantum dot 50, the photon energy $E_{QD}$ decreases. By applying the appropriate negative voltage $V_{piezo}$, $E_{cav}$ and $E_{QD}$ may be brought to a perfect match.

If the temperature increases from T1 to T2, $E_{cav}$ increases and $E_{QD}$ decreases, and the radiation efficiency will drop. This negative effect can be compensated by applying a different voltage as shown in FIG. 2. In case of a positive voltage $V_{piezo}$, $E_{cav}$ and $E_{QD}$ will be shifted together and a perfect match may be also achieved at the temperature T2.

In order to control the voltage $V_{piezo}$ that is applied by the voltage source 150, the controller 160 may be connected to a detector which detects the photons P emitted through the first mirror 30. For instance, a feed-back loop may be provided which controls the voltage $V_{piezo}$ in order to keep $E_{cav}$ and $E_{QD}$ matched and the photon emission at its maximum level.

Figure 4:
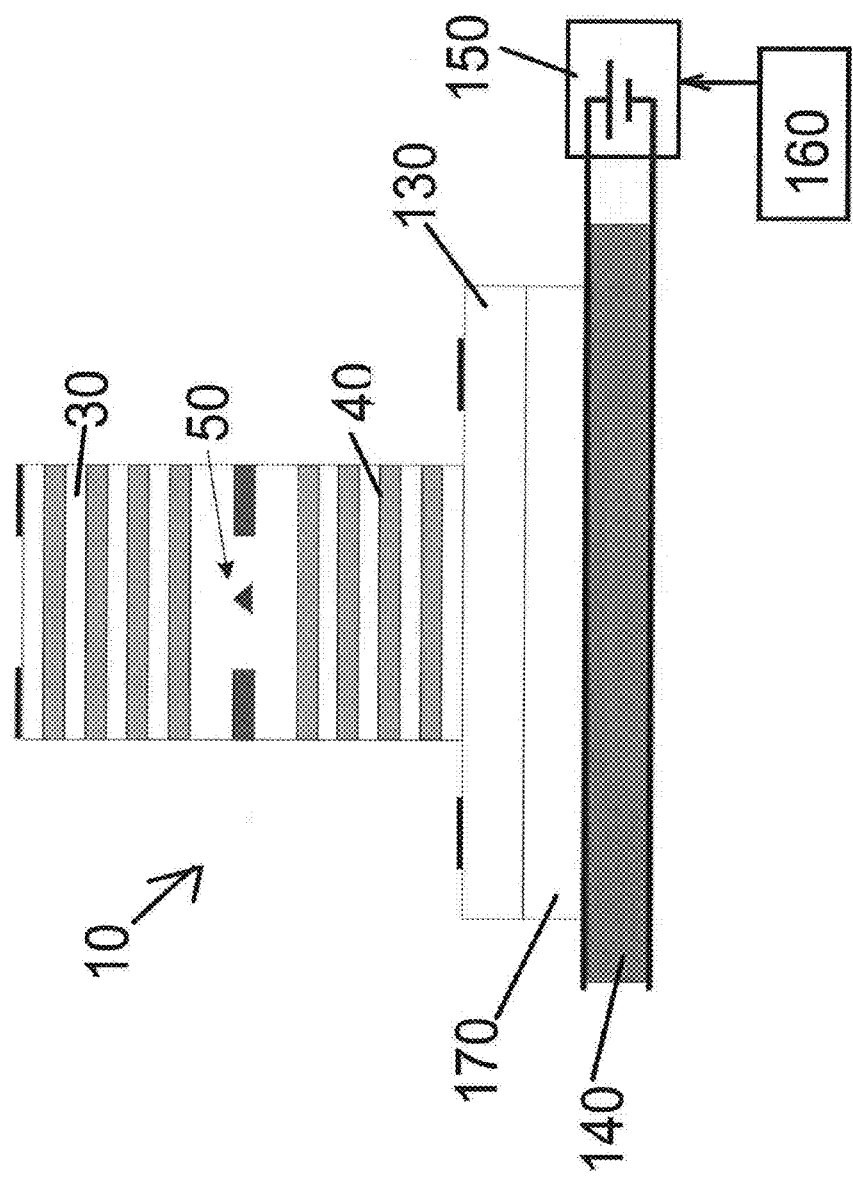
FIG. 4 shows a second exemplary embodiment of a single photon emitter according to the present invention.

FIG. 4 shows a second exemplary embodiment of a single-photon source 10 according to the present invention.

In contrast to the first embodiment, an insulating layer 170 is disposed between the substrate 130 and the piezoelectric crystal 140.

| Reference signs | |
|---|---|
| 10 | single-photon source |
| 20 | cavity |
| 30 | first mirror |
| 40 | second mirror |
| 41 | second mirror's outer surface |
| 50 | quantum dot |
| 55 | active layer |
| 60 | opening |
| 70 | non-conductive layer |
| 90 | p-doped contact layer |
| 100 | n-doped contact layer |
| 110 | contact to p-doped layer 90 |
| 120 | contact to n-doped layer 100 |
| 130 | substrate |
| 131 | front surface |
| 132 | back surface |
| 140 | piezoelectric crystal |
| 150 | controllable voltage source |
| 160 | controller |
| 170 | insulating layer |
| A | surface |
| A' | surface |
| A" | surface |
| d | thickness |
| d' | thickness |
| d" | thickness |
| $f_{cav}$ | resonance frequency |
| $f_{QD}$ | radiation frequency |
| $E_{cav}$ | resonance energy |
| $E_{QD}$ | photon energy |
| H | distance |
| H' | distance |
| H" | distance |
| I | radiation |
| I' | radiation |
| P | Photon |
| R | reflection characteristic |
| T1 | temperature |
| T2 | temperature |
| $V_{piezo}$ | voltage |

The invention claimed is:

1. A single-photon source for emitting single photons, comprising
   a cavity having a first mirror and a second mirror and exhibiting a longitudinal resonance frequency between the first and second mirror;
   at least one quantum dot arranged inside said cavity, said quantum dot being strain-dependent and configured to generate radiation at a strain-dependent radiation frequency;
   a device capable exciting the quantum dot to generate radiation;
   a piezoelectric crystal being arranged outside the cavity and mechanically coupled to the second mirror's outer surface, said piezoelectric crystal configured to receive a control voltage and capable of applying either a laterally tensile and vertically compressive strain to both the cavity and the quantum dot, or a laterally compressive and vertically tensile strain to both the cavity and the quantum dot, depending on the control voltage's polarity;
   wherein, in response to said strain, the resonance frequency and the radiation frequency shift in opposite directions.

2. Single-photon source of claim 1 wherein said quantum dot is configured to increase its radiation frequency in case of laterally compressive and vertically tensile strain, and to decrease its radiation frequency in case of laterally tensile and vertically compressive strain.

3. Single-photon source of claim 1 wherein the laterally tensile and vertically compressive strain reduces the distance between the first and second mirror and increases the cavity's resonance frequency.

4. Single-photon source of claim 1 wherein the laterally compressive and vertically tensile strain increases the distance between the first and second mirror and decreases the cavity's resonance frequency.

5. Single-photon source of claim 1
   wherein the laterally tensile and vertically compressive strain reduces the distance between the first and second mirror, increases the cavity's resonance frequency, and decreases the radiation frequency; and
   wherein the laterally compressive and vertically tensile strain increases the distance between the first and second mirror, decreases the cavity's resonance frequency, and increases the radiation frequency.

6. Single-photon source of claim 1 wherein photons are coupled out of the cavity through the first mirror if the emission frequency corresponds to the longitudinal resonance frequency of the cavity.

7. Single-photon source of claim 1 wherein the strain induced by the piezoelectric crystal inside the cavity, is biaxial.

8. Single-photon source of claim 1 wherein the first and second mirror each comprise distributed Bragg reflectors.

9. Single-photon source of claim 1
   wherein the piezoelectric crystal has a surface section that is mechanically coupled to the second mirror's outer surface, and a given thickness,
   wherein the size of the surface section and the size of the second mirror's outer surface increase and the thickness decreases if the control voltage applied has a first polarity; and
   wherein the surface size of the surface section and the size of the second mirror's outer surface decrease and the thickness increases if the control voltage has an opposite second polarity.

10. Single-photon source of claim 1
wherein the piezoelectric crystal has a surface section that is mechanically coupled to the second mirror's outer surface; and
wherein the surface section of the piezoelectric crystal is at least as large as the second mirror's outer surface.

11. Single-photon source of claim 1 wherein—seen along the beam path of the photons leaving the cavity through the first mirror, the surface section of the piezoelectric crystal completely covers the second mirror's outer surface.

12. Single-photon source of claim 1 wherein an insulator is arranged between the piezoelectric crystal and the second mirror's outer surface, the insulator being configured to electrically insulate the piezoelectric crystal from the second mirror's outer surface and to forward the mechanical strain of the piezoelectric crystal to the cavity.

13. Single-photon source of claim 1 wherein the cavity is arranged on a front surface of a substrate and the piezoelectric crystal is arranged on the back surface of the substrate.

14. Single-photon source of claim 13 wherein an insulator is arranged between the piezoelectric crystal and the back surface of the substrate, the insulator being configured to electrically insulate the piezoelectric crystal from the substrate and to forward the mechanical strain of the piezoelectric crystal through the substrate to the cavity.

15. Single-photon source of claim 1 having a controller and a voltage source, which is connected to the piezoelectric crystal and controlled by the controller, wherein the controller is adapted to control the voltage of the voltage source such that the quantum dot's emission frequency corresponds to the longitudinal resonance frequency of the cavity.

16. Single-photon source of claim 1
wherein the cavity is cylindrical and forms a cylinder,
wherein the first and second mirrors are arranged at opposite cylinder end faces of the cylinder;
wherein the piezoelectric crystal is a piezoelectric crystal layer; and
wherein the quantum dot is comprised by an active layer which is parallel to the first and second mirror and the piezoelectric crystal layer.

17. Single-photon source of claim 16
wherein the quantum dot is arranged in or adjacent to a current aperture that focuses charge carriers onto the quantum dot, the current aperture being formed by an insulating layer having an opening, and the quantum dot being arranged in or adjacent to the opening, and
wherein the insulating layer is arranged parallel to the first and second mirror, the active layer, and the piezoelectric crystal layer.

18. Method of emitting single photons, particularly for use in quantum cryptography, using a single-photon source having a cavity including a first mirror and a second mirror and exhibiting a longitudinal resonance frequency between the first and second mirror, and at least one quantum dot inside said cavity, said quantum dot being strain-dependent and configured to generate radiation at a strain-dependent radiation frequency, and a device capable of exciting the at least one quantum dot to generate radiation, the method comprising the steps of:
applying a voltage to a piezoelectric crystal being arranged outside the cavity and mechanically coupled to the second mirror's outer surface,
wherein in response to said voltage the piezoelectric crystal applies either a laterally tensile and vertically compressive strain to the cavity and the quantum dot, or a laterally compressive and vertically tensile strain, depending on the voltage's polarity, and thereby shifts the resonance frequency and the radiation frequency in opposite directions.

19. Method of claim 18
wherein the laterally tensile and vertically compressive strain reduces the distance between the first and second mirror, increases the cavity's resonance frequency, and decreases the strain-dependent radiation frequency;
wherein the laterally compressive and vertically tensile strain increases the distance between the first and second mirror, decreases the cavity's resonance frequency, and increases the strain-dependent radiation frequency; and
wherein the voltage applied to the piezoelectric crystal is varied until the emission frequency corresponds to the longitudinal resonance frequency of the cavity.

* * * * *